US008004294B2

(12) United States Patent
Hirota

(10) Patent No.: US 8,004,294 B2
(45) Date of Patent: Aug. 23, 2011

(54) METHOD OF MANUFACTURING ACTUATORS, A METHOD OF MEASURING A THICKNESS OF AN ACTIVE LAYER OF AN ACTUATOR, A METHOD OF MANUFACTURING A RECORDING HEAD, AND A RECORDING DEVICE

(75) Inventor: Atsushi Hirota, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 438 days.

(21) Appl. No.: 12/325,971

(22) Filed: Dec. 1, 2008

(65) Prior Publication Data

US 2009/0139087 A1 Jun. 4, 2009

(30) Foreign Application Priority Data

Nov. 30, 2007 (JP) ................................. 2007-309808

(51) Int. Cl.
*G01R 27/08* (2006.01)
*B23P 17/00* (2006.01)
*B41J 29/38* (2006.01)

(52) U.S. Cl. ............................ 324/713; 29/890.1; 347/9

(58) Field of Classification Search .................. 324/713; 347/2, 5, 9–12; 29/593, 25.35, 890.1
See application file for complete search history.

(56) References Cited

U.S. PATENT DOCUMENTS

2005/0052482 A1* 3/2005 Ito et al. .......................... 347/10
2006/0090337 A1* 5/2006 Yasui ........................... 29/890.1

FOREIGN PATENT DOCUMENTS

JP 2005-169804 A 6/2005
JP 2007-185879 A 7/2007

* cited by examiner

*Primary Examiner* — Vincent Q Nguyen
(74) *Attorney, Agent, or Firm* — Baker Botts L.L.P.

(57) ABSTRACT

A method of manufacturing actuators for an inkjet head includes the step of measuring an absolute value of a coercive voltage of an active layer. The method further includes the step of sorting the actuators based at least on the coercive voltage. Each of the actuators includes a first electrode, a second electrode, an active layer positioned between the first electrode and the second electrode, and an inactive layer wherein the second electrode is positioned between the inactive layer and the active layer.

20 Claims, 9 Drawing Sheets

METHOD OF MANUFACTURING ACTUATORS, A METHOD OF MEASURING A THICKNESS OF AN ACTIVE LAYER OF AN ACTUATOR, A METHOD OF MANUFACTURING A RECORDING HEAD, AND A RECORDING DEVICE

CROSS REFERENCE TO RELATED APPLICATION

This application claims priority to Japanese Patent Application No. 2007-309808, filed Nov. 30, 2007, the entire subject matter and disclosure of which incorporated herein by reference.

BACKGROUND OF THE DISCLOSURE

1. Field of the Disclosure

The features herein relate to a method of manufacturing actuators, a method of measuring a thickness of an active layer of the actuator, a method of manufacturing a recording head, and a recording device.

2. Description of the Related Art

A known inkjet head provided in an inkjet printer, which ejects ink droplets onto a recording medium such as a recording sheet, includes a flow-path unit and a plurality of actuators. The flow-path unit has nozzles which eject ink droplets, and pressure chambers communicating with the nozzles. The actuators apply ejection energy to ink in the pressure chambers. An actuator applies a pressure to ink in a pressure chamber by changing the volume of the pressure chamber.

The actuators may vary in operating characteristics as a result of different manufacturing conditions (firing conditions, variation in materials, and the like). Thus, for the inkjet head having the plurality of actuators, it is desirable to sort actuators in accordance with operating characteristics, and to use actuators having equal operating characteristics. A known method of manufacturing actuators having piezoelectric layers includes a technique of sorting actuators in accordance with operating characteristics (displacement characteristics) which are estimated based on capacitances of the actuators.

However, the operating characteristics of the actuators are determined not only by the capacitances. The thickness of the active layer significantly affects the operating characteristic. Meanwhile, to measure the thickness of the active layer, an observation of a cross section of the actuator has to be performed.

SUMMARY OF THE INVENTION

According to one embodiment herein, a method of manufacturing actuators, each of the actuators comprising a first electrode, a second electrode, an active layer positioned between the first electrode and the second electrode, and an inactive layer wherein the second electrode is positioned between the inactive layer and the active layer, the method may comprise the steps of measuring an absolute value of a coercive voltage of the active layer, and sorting the actuators based at least on the coercive voltage.

According to another embodiment herein, a method of measuring a thickness of an active layer of an actuator, the actuator including a first electrode, a second electrode, the active layer positioned between the first electrode and the second electrode, and an inactive layer wherein the second electrode is positioned between the inactive layer and the active layer, the method may comprise the steps of measuring an absolute value of a coercive voltage of the active layer, and calculating an active-layer thickness by dividing the absolute value of a coercive voltage measured.

According to another embodiment herein, a method of manufacturing a recording head, the method comprising the steps of forming a flow-path unit including pressure chambers and forming an actuator including a first electrode, a second electrode, an active layer positioned between the first electrode and the second electrode, and an inactive layer wherein the second electrode is positioned between the inactive and the active layer. The method may further comprise the steps of measuring an absolute value of a coercive voltage of the active layer, sorting the actuators based at least on the coercive voltage, and assembling the sorted actuators with the flow-path unit.

Other objects, features and advantages will be apparent to those skilled in the art from the following detailed description and accompanying drawings.

BRIEF DESCRIPTION OF THE DRAWINGS

FIG. 3 plots pressure chambers 110, apertures 112, and nozzles 108 by solid lines.

FIG. 6 schematically illustrates only one of a plurality of inkjet heads.

DESCRIPTION OF THE EMBODIMENTS

Various embodiments, and their features and advantages, may be understood by referring to FIGS. 1-9, like numerals being used for corresponding parts in the various drawings.

Figure 1:
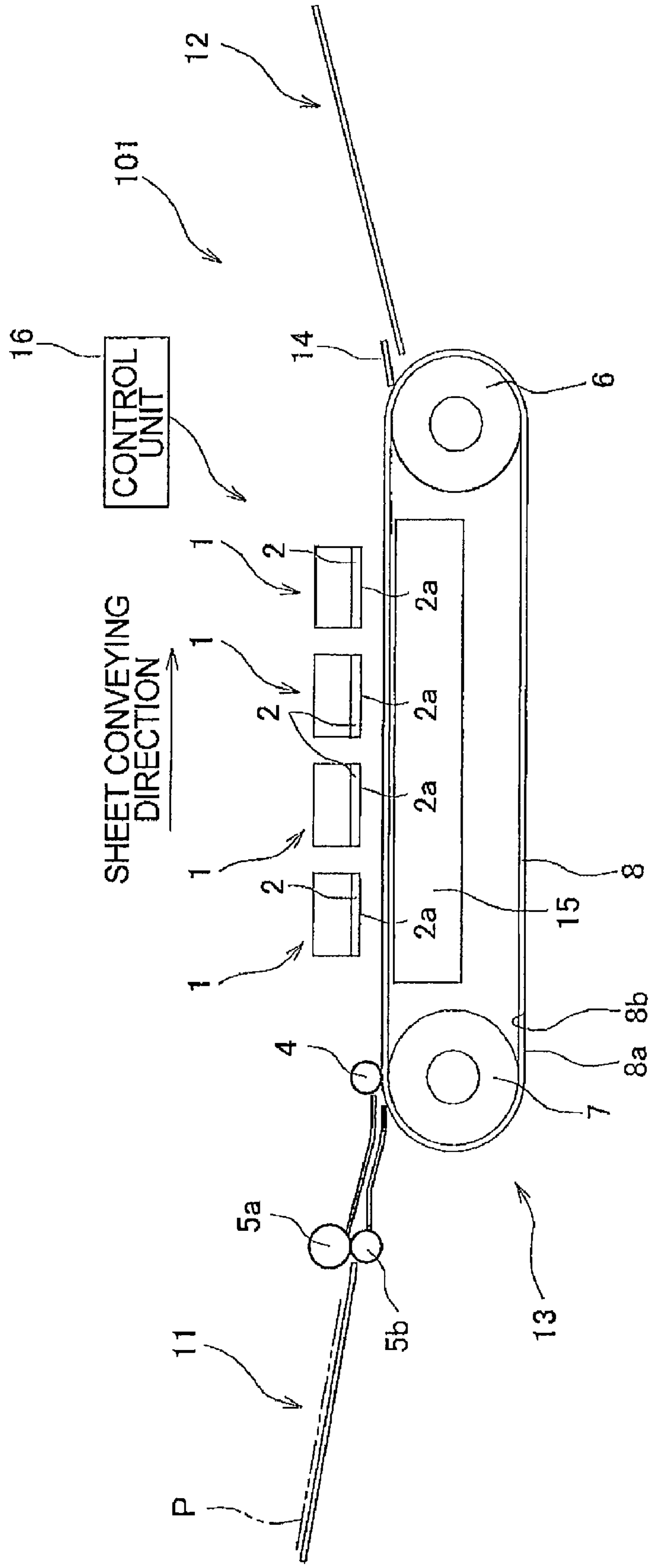
FIG. 1 is an external side view of an inkjet printer according to an embodiment.

Referring to FIG. 1, an inkjet printer 101 may be a color inkjet printer including a plurality of, e.g., four, inkjet heads 1. The inkjet printer 101 may have a feed section 11 on the left side in the drawing, and a discharge section 12 on the right side in the drawing.

A sheet-conveying path may be positioned in the inkjet printer 101. A sheet P may be conveyed from the feed section 11 to the discharge section 12 through the sheet-conveying path. A plurality of, e.g., two, feed rollers **5*a* and 5*b* may be positioned directly downstream of the feed section 11. The feed rollers 5*a* and 5*b* may nip and convey the sheet P, so as to feed the sheet P from the feed section 11 toward the right side in the drawing. A conveyance mechanism 13 may be positioned in an intermediate portion of the sheet-conveying path. The conveyance mechanism 13 may include a plurality of, e.g., two, belt rollers 6 and 7, an endless conveying belt 8 which is wound around the belt rollers 6 and 7, and a platen 15 which is positioned in a region surrounded by the conveying belt 8. The platen 15 may support the conveying belt 8 at a position opposing the inkjet head 1, so as to prevent the conveying belt 8 from being bent downwardly. A nip roller 4 may be positioned at a position opposing the belt roller 7. The nip roller 4 may press the sheet P, which is fed from the feed section 11 by the feed rollers 5***a* and 5*b*, to an outer peripheral surface 8*a* of the conveying belt 8.

When a conveying motor 19 (see FIG. 6) rotates the belt roller 6, the conveying belt 8 may travel. Hence, the conveying belt 8 may convey the sheet P, which is pressed to the outer peripheral surface 8*a* by the nip roller 4, toward the discharge section 12 while the conveying belt 8 adhesively holds the sheet P. A low-adhesive silicone resin layer may be formed on the surface of the conveying belt 8.

A separation mechanism 14 may be positioned directly downstream of the conveying belt 8. The separation mechanism 14 may separate the sheet P, which adheres on the outer peripheral surface 8*a* of the conveying belt 8, from the outer peripheral surface 8*a*, and guide the sheet P to the discharge section 12 positioned on the right side in the drawing.

The plurality of inkjet heads 1 corresponding to a plurality of color inks, e.g., magenta, yellow, cyan, black, may be arranged and fixed in a conveying direction. The plurality of inkjet heads 1 may respectively have head bodies 2 at lower ends thereof. The head bodies 2 each may have a rectangular-parallelepiped shape elongated in a direction orthogonal to the conveying direction. Bottom surfaces of the head bodies 2 may function as ink ejection surfaces 2*a*, which opposes the outer peripheral surface 8*a*. When the sheet P conveyed by the conveying belt 8 passes through an area directly below the plurality of head bodies 2, the color inks may be respectively ejected from the ink ejection surfaces 2*a* onto an upper surface, i.e., a print surface of the sheet P. Hence, a desired color image may be formed on the print surface of the sheet P.

Figure 2:
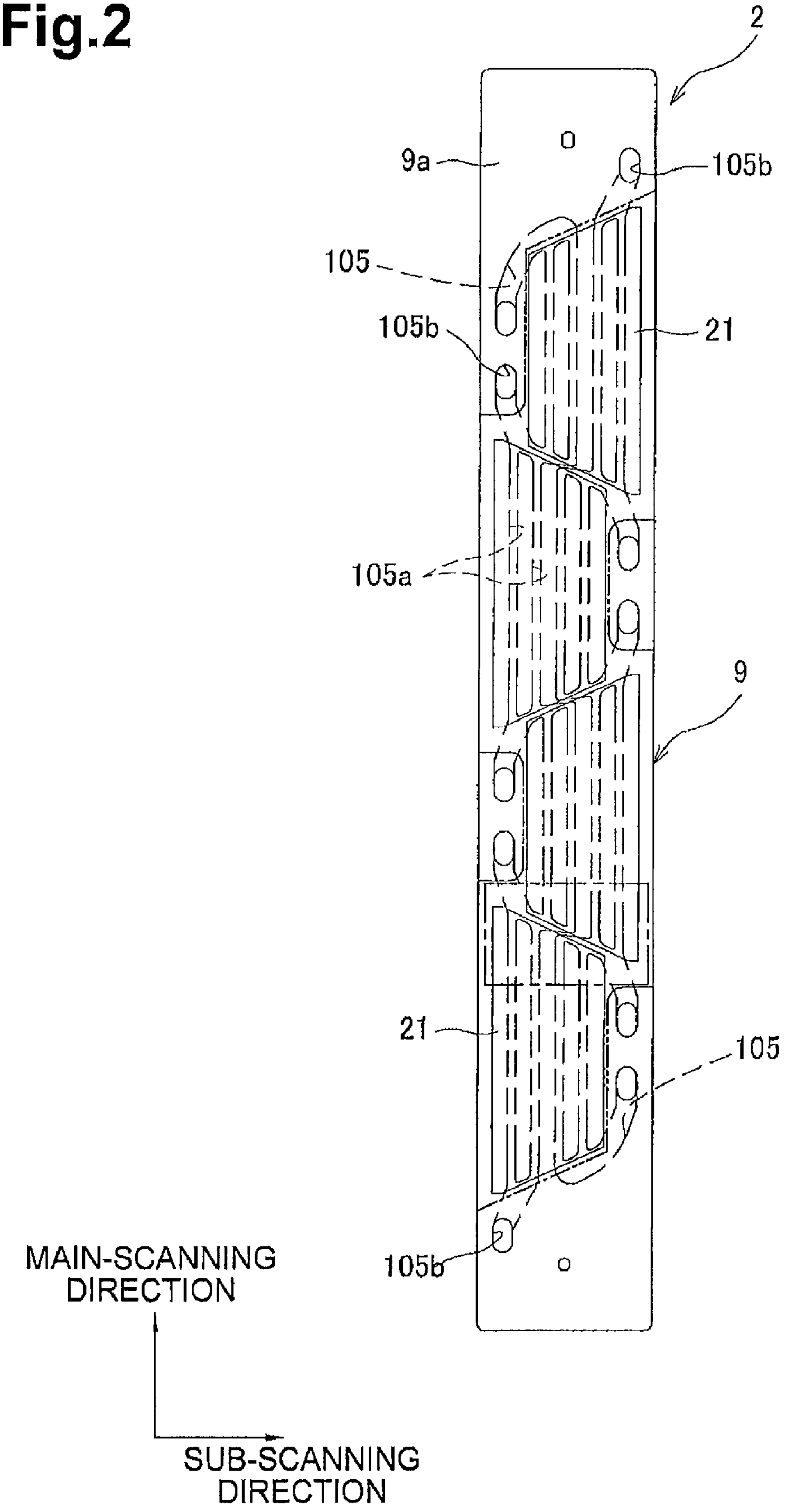
FIG. 2 is a plan view of a head body.

Referring to FIG. 2, the head body 2 may constitute the inkjet head 1 when the head body 2 is assembled with a driver IC 51 (see FIG. 6) which generates driving signals to drive a reservoir unit (not shown) for supplying ink, and an actuator unit 21. A plurality of, e.g., four, actuator units 21 may be positioned on an upper surface 9*a* of a flow-path unit 9 in the head body 2. The actuator unit 21 may have a trapezoidal flat surface. The actuator unit 21 may be made of a ferroelectric material of lead zirconate titanate (PZT) ceramics.

Figure 3:
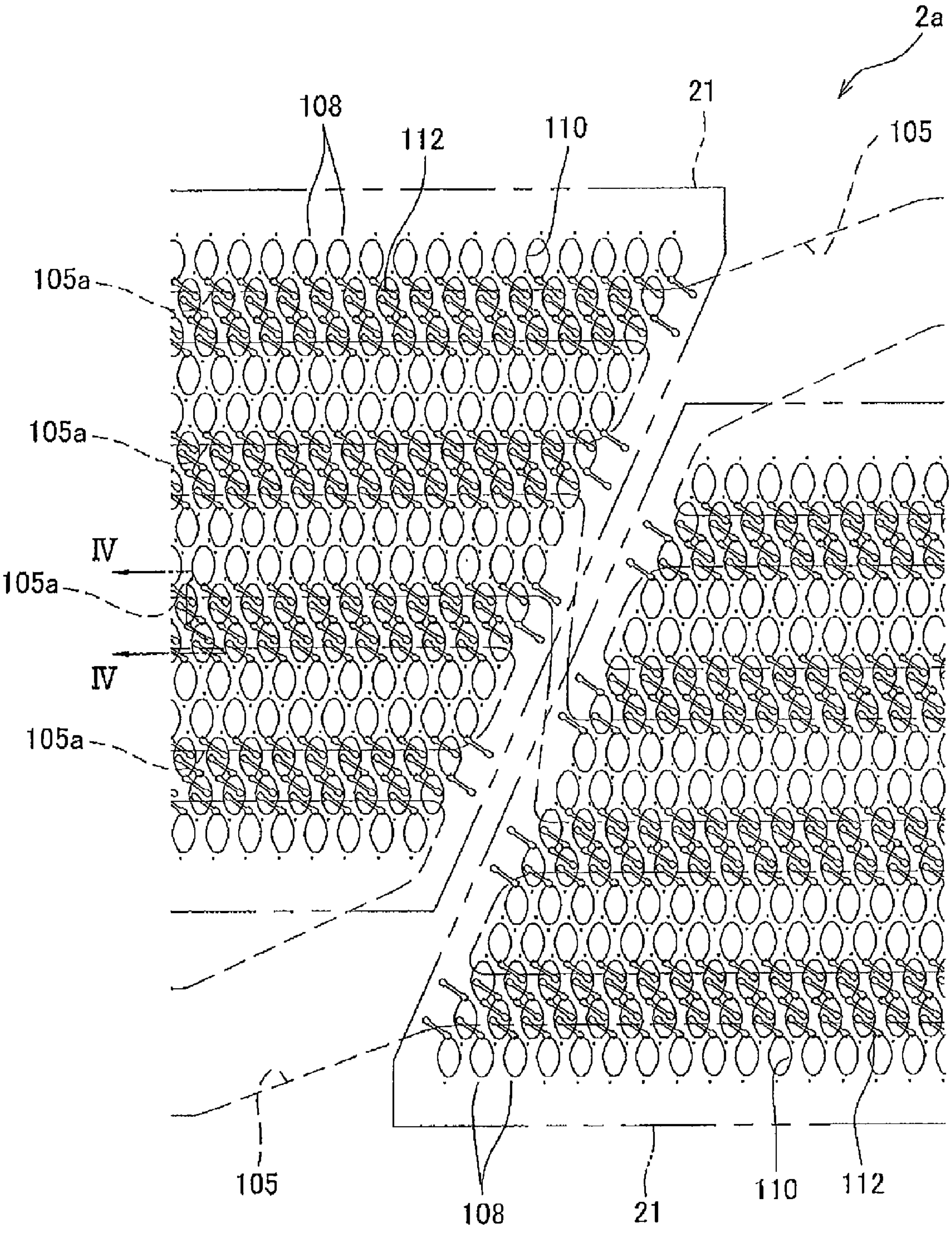
FIG. 3 is an enlarged view of a region surrounded by a dotted-chain line shown in FIG. 2.

Referring to FIG. 3, an ink flow path containing the pressure chambers 110 and other components may be formed inside the flow-path unit 9. Each actuator unit 21 may include a plurality of actuators respectively corresponding to the pressure chambers 110. The actuator unit 21 may apply ejection energy selectively to ink in the pressure chambers 110 when the actuator unit 21 is driven by the driver IC 51.

Referring back to FIG. 2, the flow-path unit 9 may have a rectangular-parallelepiped shape. A plurality of, e.g., ten in total, ink supply ports 105*b* may be formed in the upper surface 9*a* of the flow-path unit 9. The ink supply ports 105*b* may correspond to ink ejection paths (not shown) of the reservoir unit. Referring to FIGS. 2 and 3, manifold flow paths 105 and sub-manifold flow paths 105*a* may be formed in the flow-path unit 9. The manifold flow paths 105 may communicate with the ink supply ports 105*b*. The sub-manifold flow paths 105*a* may be split from the manifold flow paths 105. The ink ejection surface 2*a* may be formed on a lower surface of the flow-path unit 9. A plurality of nozzles 108 may be arranged in a matrix in the ink ejection surface 2*a*. Similarly to the nozzles 108, the pressure chambers 110 may be arranged in a matrix in a fixing surface of the flow-path unit 9, on which the actuator units 21 are fixed.

The array of the pressure chambers 110 may be arranged at regular intervals in a longitudinal direction of the flow-path unit 9. The array of the pressure chamber 110 may comprise sixteen rows arranged in parallel to a short-side direction of the flow-path unit 9. The number of pressure chambers 110 contained in each row may gradually decrease from a long side toward a short side of the actuator unit 21, so as to be consistent with an external shape, e.g., trapezoidal shape, of the actuator unit 21. The nozzles 108 may be arranged in a similar manner to the pressure chambers 110.

Figure 4:
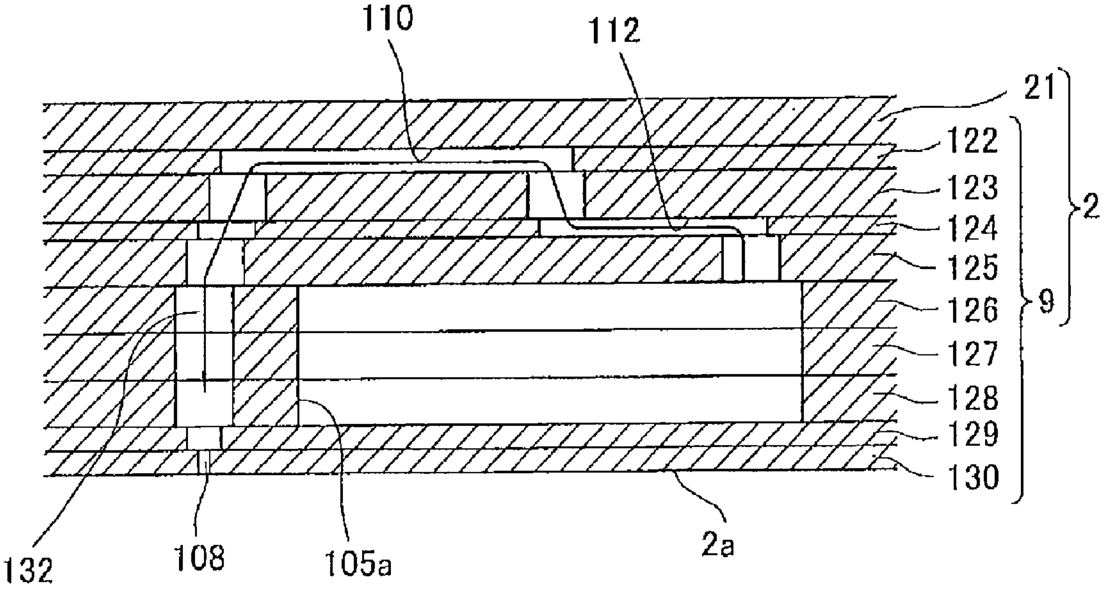
FIG. 4 is a cross-sectional view taken along the line IV-IV shown in FIG. 3.

Referring to FIG. 4, the flow-path unit 9 may include a plurality of, e.g., nine, plates 122 to 130 made of a metal material such as stainless steel. The plates 122 to 130 may have rectangular flat surfaces elongated in a main-scanning direction.

Through holes formed in the plates 122 to 130 may be connected by positioning and stacking the plates 122 to 130, and hence, multiple individual ink-flow paths 132 may be formed. The individual ink-flow paths 132 may extend from the manifold flow paths 105 to the sub-manifold flow paths 105*a*. Then, the individual ink-flow paths 132 may extend from outlet ports of the sub-manifold flow paths 105*a*, through the pressure chambers 110, to the nozzles 108.

Ink, which is supplied from the reservoir unit to the inside of the flow-path unit 9 through the ink supply port 105*b*, may flow in the manifold flow path 105 and may be split into the sub-manifold flow paths 105*a*. The ink in the sub-manifold flow paths 105*a* may flow into the individual ink-flow paths 132, and may reach the nozzles 108 through the apertures 112, which function as ink-limiting holes, and through the pressure chambers 110.

Figure 5:
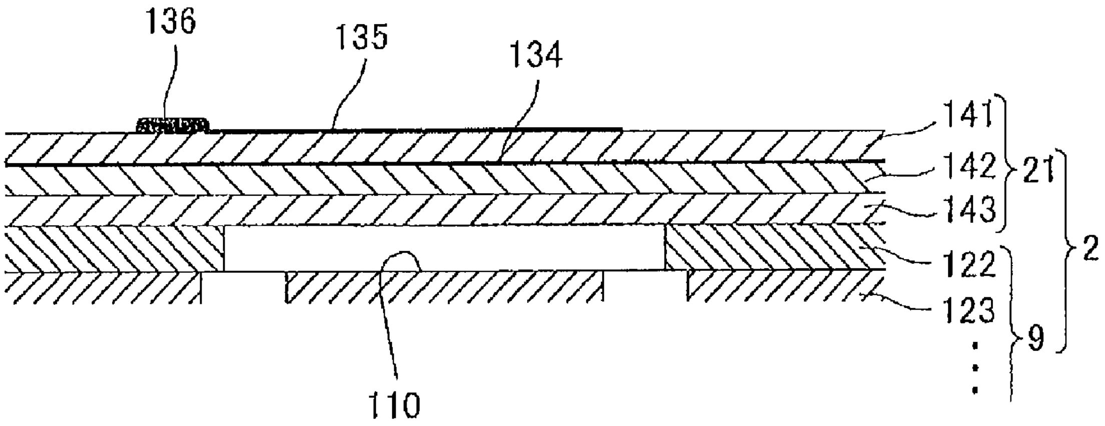
FIG. 5 is a cross-sectional view of an actuator unit.

Referring to FIG. 5, the actuator unit 21 may include three piezoelectric sheets (piezoelectric layers) 141 to 143. Individual electrodes 135 may be positioned on the piezoelectric sheet 141 at positions corresponding to the pressure chambers 110. Each individual electrode 135 may include an electrode portion and an extending portion. The electrode portion may be positioned at a position corresponding to a pressure chamber 110. The extending portion may extend to the outside of a region corresponding to the pressure chamber 110. A land 136 may be formed on the extending portion. A common electrode 134 may be positioned between the piezoelectric sheet 141, which is a top layer, and the piezoelectric sheet 142 positioned below the piezoelectric sheet 141. The common electrode 134 may extend over an entire plane between the piezoelectric sheets 141 and 142.

A ground potential may be equally applied to regions of the common electrode 134 corresponding to the pressure chambers 110. The individual electrodes 135 may be electrically connected with the driver IC 51. Driving signals from the driver IC 51 may be selectively input to the individual electrodes 135. A portion positioned between the individual electrode 135 and the pressure chamber 110 in the actuator unit 21 may serve as an individual actuator. A plurality of actuators may be formed by a number corresponding to the number of pressure chambers 110.

The piezoelectric sheet 141 may be polarized in a thickness direction thereof. A portion of the piezoelectric sheet 141 corresponding to the individual electrode 135 may serve as an active portion which is bent by a piezoelectric effect. When the individual electrode 135 has a potential different from the potential of the common electrode 134, an electric field may be applied to the active portion in a polarization direction. The active portion may be expanded in the thickness direction and contracted in a surface direction when the polarization direction corresponds to the direction of an electric-field direction. At this time, a displacement in the surface direction may be larger than the displacement in the thickness direction. As described above, the actuator unit 21 may be a so-called unimorph-type actuator, in which the upper piezoelectric sheet 141 spaced from the pressure chamber 110 serves as an active layer including the active portion, and in which the lower a plurality of, e.g., two, piezoelectric sheets 142 and 143 proximate to the pressure chamber 110 serve as inactive layers.

The piezoelectric sheets 141 to 143 may be positioned on an upper surface of the cavity plate 122. The cavity plate 122 may partition the pressure chambers 110. If a deformation of the electric-field applied portion of the piezoelectric sheet 141 is not consistent with deformations of corresponding portions of the piezoelectric sheets 142 and 143, the piezoelectric sheets 141 to 143 may be entirely deformed to bulge inward of the pressure chamber 110. Hence, a pressure (ejection energy) may be applied to ink in the pressure chamber 110, causing a pressure wave to be generated in the pressure chamber 110. The generated pressure wave may propagate from the pressure chamber 110 to the nozzle 108. Thus, the nozzle 108 may eject an ink droplet.

The driver IC 51 may output a driving signal so as to preliminarily apply a predetermined potential to the individual electrode 135 again, to temporarily apply a ground potential to the individual electrode 135 every ejection request, and then to apply the predetermined potential to the individual electrode 135 at a given timing. Accordingly, the pressure of the ink in the pressure chamber 110 may decrease when the potential of the individual electrode 135 becomes the ground potential, and the ink may be sucked from the sub-manifold flow path 105*a* to the individual ink-flow path 132. Then, the pressure of the ink in the pressure chamber 110 may increase when the potential of the individual electrode 135 becomes the predetermined potential again, and the nozzle 108 may eject an ink droplet. Namely, a rectangular-wave pulse may be applied to the individual electrode 135. The pulse width of the rectangular-wave pulse may be an acoustic length (AL) representing a time length in which a pressure wave propagates from an outlet port of the sub-manifold flow path 105*a* to a tip end of the nozzle 108 in the pressure chamber 110. When the pressure of the ink in the pressure chamber 110 is reversed from a negative pressure to a positive pressure, both pressures may be added. Hence, the nozzle 108 may eject an ink droplet with a high pressure.

Figure 6:
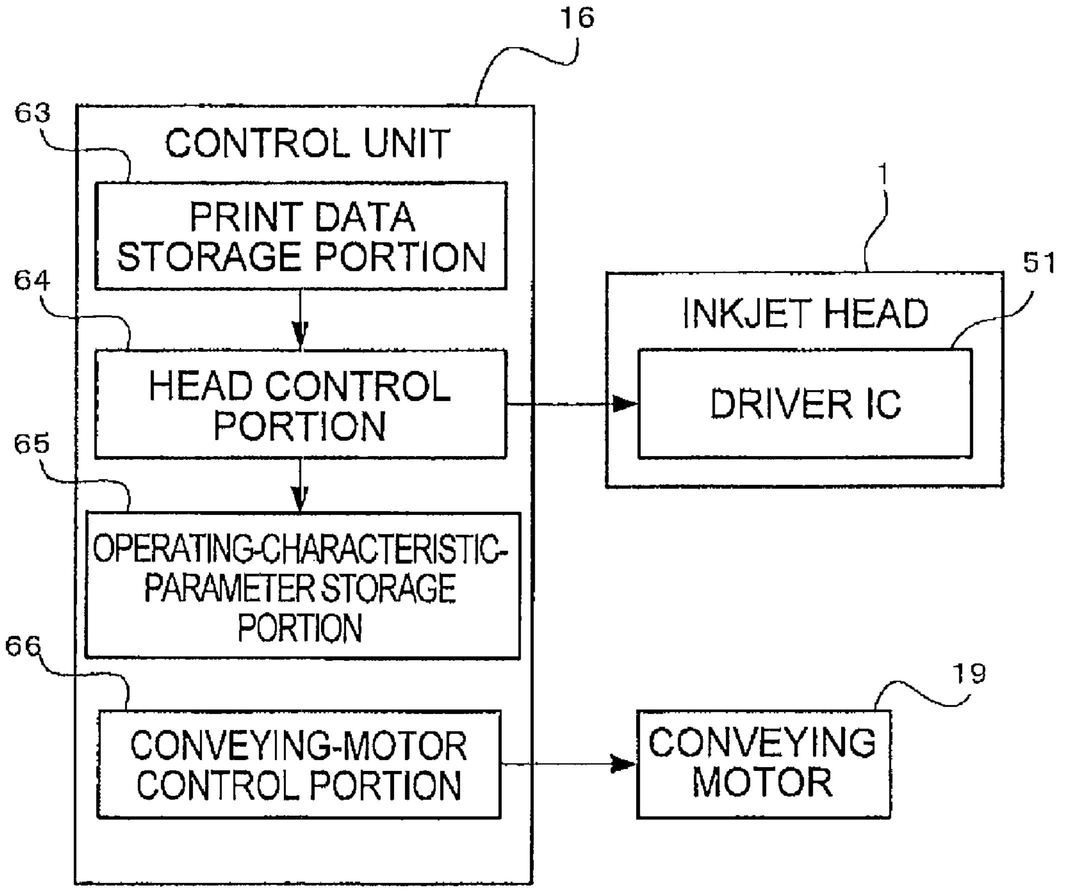
FIG. 6 is a function block diagram of a control unit.

Referring to FIG. 6, the control unit 16 may include an operating-characteristic-parameter storage portion 65, a print data storage portion 63, a head control portion 64, and a conveying-motor control portion 66.

The operating-characteristic-parameter storage portion 65 may store an operating characteristic parameter which represents a displacement 6 of the actuator unit 21 when a voltage is applied between the individual electrodes 135 and the common electrode 134. The operating characteristic parameter may be calculated when the actuator unit 21 is manufactured. The inkjet head 1 may include the plurality of, e.g., four, actuator units 21, and the plurality of, e.g., four, actuator units 21 having substantially equal operating characteristic parameters. Hence, the operating-characteristic-parameter storage portion 65 may store a single operating characteristic parameter.

The print data storage portion 63 may store print data which is transferred from a host computer (not shown). The print data may contain image data which relates to an image to be formed on a sheet P. The head control portion 64 may control the inkjet head 1 by outputting a control signal to the driver IC 51 so as to form an image on a sheet P, which is conveyed by the conveyance mechanism 13, in accordance with the print data stored in the print data storage portion 63.

The conveying-motor control portion 66 may control a driving speed of the conveying motor 19 so as to drive the conveying belt 8 at a predetermined speed pattern (containing an acceleration pattern, a constant-speed pattern, and a deceleration pattern).

The head control portion 64 may control ejection of an ink droplet from the nozzle 108 of the inkjet head 1 so as to print an image, which relates to the image data contained in the print data stored in the print data storage portion 63, onto the conveyed sheet P. At this time, the head control portion 64 may control the driver IC 51 so that the volume of the ink droplet to be ejected from the nozzle 108 becomes a predetermined amount, in accordance with the operating characteristic parameter stored in the operating-characteristic-parameter storage portion 65. In particular, a waveform pattern may be generated, such that a pulse width of a driving signal decreases as a displacement of the actuator unit 21 indicated by the operating characteristic parameter increases. Accordingly, variation in ink ejection characteristics of nozzles 108 may be reduced in inkjet heads 1 including the actuator units 21 having different operating characteristic parameters.

Figure 7:
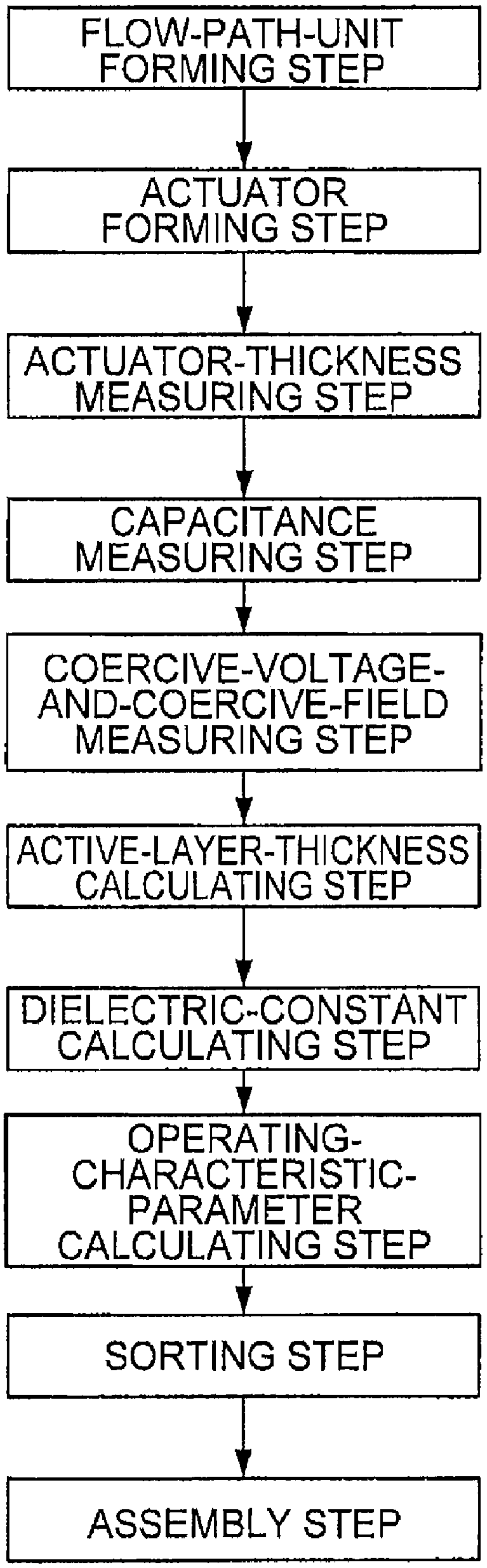
FIG. 7 is a step block diagram of a method of manufacturing an inkjet head.

Referring to FIG. 7, the method of manufacturing the inkjet head 1 may include a flow-path-unit forming step, an actuator forming step, an actuator-thickness measuring step, a capacitance measuring step, a coercive-voltage-and-coercive-field measuring step, an active-layer-thickness calculating step, a dielectric-constant calculating step, an operating-characteristic-parameter calculating step, a sorting step, and an assembly step.

In the flow-path-unit forming step, the plates 122 to 130 may be positioned, stacked, and bonded, thereby forming the flow-path unit 9. In the actuator forming step, a conductive pattern later serving as the common electrode 134 may be printed on a surface of a green sheet later serving as the piezoelectric sheet 141. Green sheets later serving as the piezoelectric sheets 142 and 143 may be stacked in that order on the former green sheet such that the conductive pattern later serving as the common electrode 134 is interposed between the former green sheet and the two latter green sheets. Thereby forming a green-sheet stack may be constituted. After the green-sheet stack is fired, a conductive pattern containing the plurality of individual electrodes 135 may be printed on another surface of the piezoelectric sheet 141, and the stack is fired again, thereby forming the actuator unit 21.

In the actuator-thickness measuring step, an actuator thickness t0 may be measured. The actuator thickness t0 may be a total thickness of the actuator unit 21 formed in the actuator forming step. In this embodiment, in the capacitance measuring step, a total capacitance between all the individual electrodes 135 and the common electrode 134 of the actuator unit 21 may be measured, and the measured total capacitance may be divided by the number of the individual electrodes 135, thereby calculating an average of capacitances C of the individual electrodes 135. For sampling, individual capacitances of a predetermined number of individual electrodes 135 at predetermined positions may be measured for every actuator unit 21, and an average of the individual capacitances may be used as a capacitance C.

In the coercive-voltage-and-coercive-field measuring step, a coercive field E0 of the piezoelectric sheet 141, which is the active layer of the actuator unit 21, may be previously obtained. A coercive field may be an electric field generated when the polarization of a ferroelectric, such as the piezoelectric sheet 141, is reversed. The coercive field may be one of parameters representing an electrical property of a ferroelectric material. In the coercive-voltage-and-coercive-field measuring step, the piezoelectric sheet 141 may be used for measurement of the coercive field E0 of the piezoelectric sheet 141. However, in this embodiment, a coercive field E0 of a measurement sample may be measured. The measurement sample may be selected from a single lot of actuator units 21 formed in the actuator forming step with the same material under the same firing condition. The actuator units 21 formed with the same material under the same firing condition may exhibit substantially similar coercive fields E0.

Figure 8:
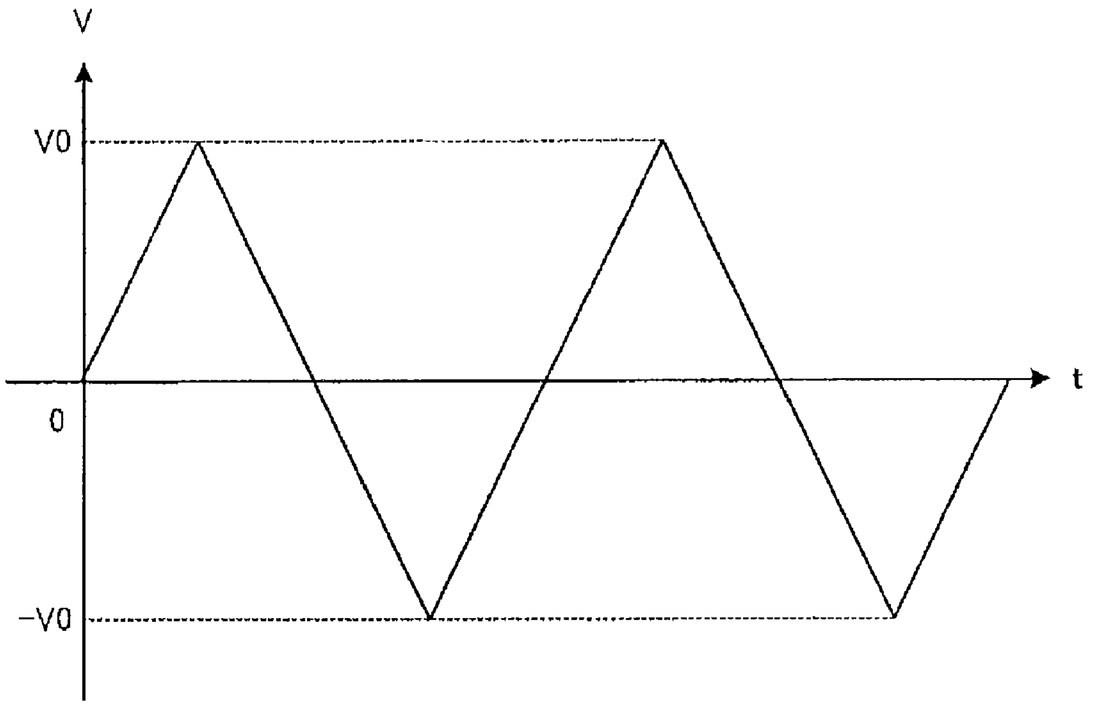
FIG. 8 is a diagram illustrating a driving waveform to be output to the actuator unit in a coercive-voltage-and-coercive-field measuring step shown in FIG. 7.

Referring to FIG. 8, the polarization-voltage hysteresis characteristic of the measurement sample may be measured. In particular, a voltage in a waveform of continuous triangular waves may be applied between an individual electrode 135 and a common electrode 134 of the measurement sample. Note that V0 and −V0, which are peak voltage values in the waveform pattern, may completely polarize the measurement sample.

Figure 9:
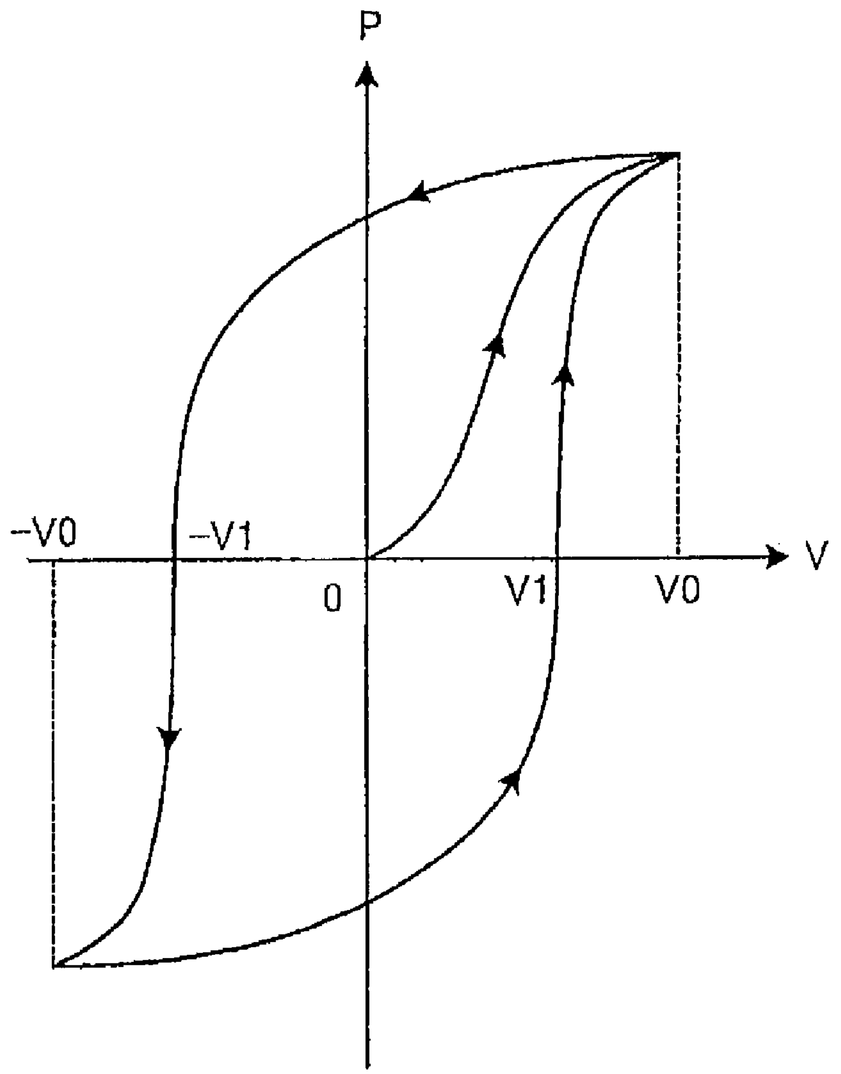
FIG. 9 is a graph plotting a polarization-voltage hysteresis characteristic obtained from the measurement sample, to which the voltage in the waveform pattern in FIG. 8 is applied.

Referring to FIG. 9, when the voltage in the waveform pattern is applied to the measurement sample, application of the voltage may be started from a state in which the measurement sample is not polarized. The degree of polarization of the measurement sample may increase as the applied voltage increases. When the applied voltage further increases and reaches V1, the measurement sample may be completely polarized.

After the measurement sample is completely polarized, the applied voltage may decrease. As the applied voltage decreases, the degree of polarization of the measurement sample may decrease. However, even when the applied voltage becomes zero, the polarization of the measurement sample does not become zero because a remnant polarization remains in the measurement sample. When the applied voltage further decreases and becomes −V1, the polarization of the measurement sample may become zero. When the applied voltage further decreases, reversal of the polarization may be started. When the applied voltage becomes −V0, the measurement sample may be completely polarized again. Although the degree of polarization of the measurement sample decreases as the applied voltage increases, even when the applied voltage becomes zero, the polarization of the measurement sample does not become zero because a remnant polarization remains in the measurement sample. When the applied voltage further increases and becomes V1, the polarization of the measurement sample may become zero again. An absolute value of the applied voltage V1 or −V1 when the polarization becomes zero may be assumed as a coercive voltage V of the measurement sample. An active-layer thickness t1 of the measurement sample may be measured, and the coercive voltage V may be divided by the measured thickness t1, thereby calculating a coercive field E0. Note that the active-layer thickness t1 may be measured by cutting the measurement sample along the thickness direction, and by observing a cross section of the measurement sample with an electron microscope.

In the coercive-voltage-and-coercive-field measuring step, a coercive voltage V of the active layer of the actuator unit 21 as an object to be sorted, namely, a coercive voltage V of the piezoelectric sheet 141, may be measured. Similarly to the above-described measurement sample, a polarization-voltage hysteresis characteristic of the piezoelectric sheet 141 may be measured. In particular, a voltage in the form of triangular waves shown in FIG. 8 may be applied between an individual electrode 135 and a common electrode 134, so as to measure the polarization-voltage hysteresis characteristic of the piezoelectric sheet 141. Then, an absolute value of the applied voltage V1 or −V1 when the polarization becomes zero obtained from the measured polarization-voltage hysteresis characteristic may be determined as a coercive voltage V of the piezoelectric sheet 141.

Referring back to FIG. 7, in the active-layer-thickness calculating step, an active-layer thickness t1, which is a thickness of the piezoelectric sheet 141, namely, a thickness of the active layer, may be calculated as follows:

$$t1=V/E0$$

In the dielectric-constant calculating step, a dielectric constant ∈ of the piezoelectric sheet 141, namely, a dielectric constant ∈ of the active layer, may be calculated based on the capacitance C measured in the capacitance measuring step, the active-layer thickness t1 calculated in the active-layer-thickness calculating step, and an electrode area S, which is a surface area of an individual electrode 135. It is assumed that the electrode area S may be a design value of the individual electrode 135. The capacitance C may be expressed as follows:

$$C=\in\cdot S/t1\ (\in=\in 0\cdot\in')$$

where ∈ is a dielectric constant of the piezoelectric sheet 141, ∈0 is a dielectric constant of vacuum, and ∈' is a relative dielectric constant. Hence, the dielectric constant ∈ may be calculated as follows:

$$\in=C\cdot t1/S$$

In the operating-characteristic-parameter calculating step, an operating characteristic parameter may be calculated based on the actuator thickness t0 measured in the actuator-thickness measuring step, the capacitance C measured in the capacitance measuring step, the active-layer thickness t1 calculated in the active-layer-thickness calculating step, and the dielectric constant ∈ calculated in the dielectric-constant calculating step. As described above, the operating characteristic parameter may represent a displacement δ of the actuator unit 21 when a voltage is applied between an individual electrode 135 and a common electrode 134. The displacement δ may be expressed as follows by using the values obtained through the actual measurement and analysis:

$$\delta=f(t1,t0,\in)$$

The displacement δ may be calculated as the operating characteristic parameter based on the above expression.

In the sorting step, actuator units 21 may be sorted based on operating characteristic parameters calculated for the actuator units 21 in the operating-characteristic-parameter calculating step. In the assembly step, four actuator units 21, which have operating characteristic parameter sorted into a single category in the sorting step, may be assembled with the flow-path unit 9 formed in the flow-path-unit forming step. Further, required electric components (including a chip on film (COF) with a driver IC 51 (see FIG. 6) mounted and a control board, which are connected to each actuator unit 21), ink-supply components, a protection cover, and other components may be assembled. Thus, manufacturing of the inkjet head 1 may be completed.

In this embodiment described above, the active-layer thickness t1, which is the thickness of the piezoelectric sheet 141, namely, the thickness of the active layer, may be calculated based on the coercive voltage V (actually measured value) and the coercive field E0 (previously obtained value) of the piezoelectric sheet 141. Also, the dielectric constant ∈ may be calculated based on the capacitance C (actually measured value), the active-layer thickness t1, and the electrode area S (previously determined value). Then, the operating characteristic parameter may be calculated by using the active-layer thickness t1, the actuator thickness t0, and the dielectric constant ∈. As described above, because the operating characteristic parameter is calculated by using the active-layer thickness t1, the actuator thickness t0, and the dielectric constant C, which significantly affect the displacement of the actuator unit 21, an accurate operating characteristic parameter of the actuator unit 21 may be easily obtained. At this time, because the active-layer thickness t1 is calculated by using the coercive voltage V of the active layer, the actuator unit 21 may be not damaged. In addition, because the plurality of actuator units 21, which have the operating characteristic parameters sorted into the single category, may be assembled in the inkjet head 1, ink ejection characteristics of the nozzles of the inkjet head 1 may be equalized.

Further, because the actually measured values of the capacitance C and actuator thickness t0 are used, a further accurate operating characteristic parameter may be calculated.

Because the driver IC 51 is controlled so that an ink droplet is ejected from a nozzle 108 by a predetermined volume, based on the operating characteristic parameter of the actuator unit 21 stored in the operating-characteristic-parameter storage portion 65, variation in ink ejection characteristics of the nozzles 108 may be reduced in the inkjet heads 1 including the actuator units 21 having different operating characteristic parameters.

Although embodiments have been described in detail herein, the scope of this patent is not limited thereto. It will be appreciated by those of ordinary skill in the relevant art that various modifications may be made without departing from the scope of the invention. Accordingly, the embodiments disclosed herein are exemplary, and are not limiting. It is to be understood that the scope of the invention is to be determined by the claims.

As an example modification, in the above-described embodiment, although the dielectric constant ∈ is calculated based on the capacitance C measured in the capacitance measuring step, the active-layer thickness t1 calculated by using the actually measured coercive voltage V, and the electrode area S of the design value, it is not limited thereto. A dielectric constant ∈ may be calculated by using a previously determined capacitance C, or by using an electrode area S of an actually measured value.

Furthermore, in the above-described embodiment, although the displacement δ of the actuator unit 21 is calculated by using the calculated active-layer thickness t1, the actuator thickness t0 measured in the actuator-thickness measuring step, and the calculated dielectric constant ∈, it is not limited thereto. An electrode area S may be calculated by using an actually measured capacitance C, a calculated active-layer thickness t1, and a previously determined dielectric constant ∈. Also, a displacement δ may be calculated by using the active-layer thickness t1, the actuator thickness t0, and the calculated electrode area S. In particular, the capacitance C may be derived as follows:

$$C=\in\cdot S/t1,$$

then, the electrode area S may be calculated as follows:

$$S=C\cdot t1/\in,$$

and finally, the displacement δ may be calculated as follows by using the values obtained through the actual measurement and analysis:

$$\delta=f'(t1,t0,S)$$

At this time, a displacement δ may be calculated by using previously determined dielectric constant ∈ and electrode area S. In particular, the active-layer thickness t1 is obtained as follows:

$$t1=\in\cdot S/C$$

and then, the displacement δ may be calculated as follows by using the values obtained through the actual measurement and analysis:

$$\delta=f''(t1,t0)$$

Alternatively, a previously determined actuator thickness t0 may be used. Still alternatively, an operating characteristic parameter may be calculated as follows by using an actually measured coercive voltage V:

$$\delta=f'''(V)$$

Furthermore, in the above-described embodiment, although the piezoelectric sheet 141 is positioned between the plurality of individual electrodes 135 and the common electrode 134 to form the actuator unit 21 including the plurality of actuators, it is not limited thereto. A piezoelectric sheet may be positioned between a single individual electrode and a single common electrode to form each actuator.

Furthermore, in the above-described embodiment, although the present invention is applied to the inkjet head 1 for ejecting ink droplets, it is not limited thereto. The present invention may be widely applied to recording heads having actuators.

What is claimed is:

1. A method of manufacturing actuators for an inkjet head, each of the actuators comprising a first electrode, a second electrode, an active layer positioned between the first electrode and the second electrode, and an inactive layer wherein the second electrode is positioned between the inactive layer and the active layer, the method comprising the steps of:

measuring an absolute value of a coercive voltage of the active layer; and sorting the actuators based at least on the coercive voltage.

2. The method of claim 1, wherein the step of measuring the absolute value of the coercive voltage of the active layer comprises the substep of applying an incrementally increasing voltage between the first electrode and the second electrode until the voltage reaches a first voltage.

3. The method of claim 2, wherein the step of measuring the absolute value of the coercive voltage of the active layer further comprises the substep of applying an incrementally decreasing voltage between the first electrode and the second electrode until the voltage reaches a second voltage.

4. The method of claim 3, when the first voltage is applied between the first electrode and the second electrode, a polarization of the active layer is a maximum polarization, and when the second voltage is applied between the first electrode and the second electrode, the polarization of the active layer is zero.

5. The method of claim 4, wherein the coercive voltage is equal to an absolute value of the second voltage.

6. The method of claim 3, when the first voltage is applied between the first electrode and the second electrode, a polarization of the active layer is a maximum polarization, and when the second voltage is applied between the first electrode and the second electrode, the polarization of the active layer is the maximum polarization.

7. The method of claim 6, wherein the absolute value of the first voltage is substantially the same as the absolute value of the second voltage.

8. The method of claim 1, further comprising the step of calculating an operating characteristic parameter based at least on the coercive voltage, wherein the operating characteristic is associated with a displacement of the actuator when the voltage is applied between the first electrode and the second electrode.

9. The method of claim 8, further comprising a step of calculating an active-layer thickness, wherein the step of calculating the operating characteristic parameter further comprises the step of calculating the operating parameter based at least on the active-layer thickness.

10. The method of claim 9, wherein the step of calculating the active layer thickness comprises the step of dividing the coercive voltage measured.

11. The method of claim 9, further comprising the step of calculating the coercive field based at least on the coercive voltage and a capacitance between the first electrode and the second electrode.

12. The method of claim 9, further comprising the step of calculating the coercive field based on the coercive voltage, a thickness of one of the actuators, and capacitance between the first electrode and the second electrode.

13. The method of claim 9, further comprising the step of calculating the coercive field based at least on the coercive voltage and a thickness of one of the actuators.

14. The method of claim 13, further comprising the step of calculating a dielectric constant of the active layer, wherein the step of calculating the operating characteristic parameter further comprises the step of calculating the operating characteristic parameter based on the dielectric constant of the active layer, the coercive field, and the thickness of one of the actuators.

15. The method of claim 14, wherein the step of calculating the dielectric constant of the active layer comprises the step of dividing a value in which the active-layer thickness is multiplied by a capacitance between the first electrode and second electrode.

16. The method of claim 13, further comprising the step of calculating an electrode area, wherein the step of calculating the operating characteristic parameter further comprises the step of calculating the operating characteristic parameter based on the electrode area, the coercive filed, and the thickness of one of the actuators.

17. The method of claim 16, wherein the step of calculating the electrode area comprises the step of dividing a value in which the active-layer thickness is multiplied by a capacitance between the first electrode and second electrode.

18. A recording device, comprising a recording head manufactured by the method of manufacturing a recording head according to claim 13.

19. A method of measuring a thickness of an active layer of an actuator for an inkjet head, the actuator including a first electrode, a second electrode, the active layer positioned between the first electrode and the second electrode, and an inactive layer wherein the second electrode is positioned between the inactive layer and the active layer, the method comprising the steps of:

measuring an absolute value of a coercive voltage of the active layer; and calculating an active-layer thickness by dividing the absolute value of a coercive voltage measured.

20. A method of manufacturing a recording head for an inkjet head, the method comprising the steps of:

forming a flow-path unit including pressure chambers;

forming an actuator including a first electrode, a second electrode, an active layer positioned between the first electrode and the second electrode, and an inactive layer wherein the second electrode is positioned between the inactive and the active layer;

measuring an absolute value of a coercive voltage of the active layer;

sorting the actuators based at least on the coercive voltage; and assembling the sorted actuators with the flow-path unit.

* * * * *